United States Patent
Jang

(10) Patent No.: US 8,922,250 B2
(45) Date of Patent: Dec. 30, 2014

(54) SEMICONDUCTOR DEVICE AND SEMICONDUCTOR SYSTEM INCLUDING THE SAME

(75) Inventor: Chae-Kyu Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 668 days.

(21) Appl. No.: 13/286,524

(22) Filed: Nov. 1, 2011

(65) Prior Publication Data

US 2012/0274396 A1 Nov. 1, 2012

(30) Foreign Application Priority Data

Apr. 27, 2011 (KR) .................. 10-2011-0039667

(51) Int. Cl.
| | | |
|---|---|---|
| *H03B 1/00* | (2006.01) |
| *H03K 3/00* | (2006.01) |
| *G11C 29/12* | (2006.01) |
| *G11C 29/48* | (2006.01) |
| *G01R 31/317* | (2006.01) |

(52) U.S. Cl.
CPC ............ *G11C 29/1201* (2013.01); *G11C 29/48* (2013.01); *G01R 31/31721* (2013.01); *G11C 29/12005* (2013.01)
USPC ........... 327/108; 327/109; 327/110; 327/111; 327/112

(58) Field of Classification Search
CPC .................. H03K 19/00361; H03K 19/00315; H03K 19/00384; H04L 25/028; H04L 25/0272
USPC .................................................. 327/108–112
See application file for complete search history.

(56) References Cited

U.S. PATENT DOCUMENTS

| | | | | |
|---|---|---|---|---|
| 6,344,814 B1 * | 2/2002 | Lin et al. ....................... 341/144 |
| 6,603,328 B2 * | 8/2003 | Takahashi et al. ....... 324/762.02 |
| 7,782,080 B2 * | 8/2010 | Eaton ............................... 326/30 |
| 7,808,286 B1 * | 10/2010 | Miller et al. ................... 327/112 |
| 8,441,846 B2 * | 5/2013 | Kim ................................ 365/163 |
| 2003/0067318 A1 * | 4/2003 | Takahashi et al. ............ 324/765 |

(Continued)

FOREIGN PATENT DOCUMENTS

| | | |
|---|---|---|
| KR | 1020070036622 | 4/2007 |
| KR | 1020070036639 | 4/2007 |
| KR | 1020080043500 | 5/2008 |
| KR | 1020080114312 | 12/2008 |

OTHER PUBLICATIONS

Notice of Allowance issued by the Korean Intellectual Property Office on Jan. 16, 2013.

*Primary Examiner* — Adam Houston
(74) *Attorney, Agent, or Firm* — IP & T Group LLP

(57) ABSTRACT

A semiconductor device and a power voltage supply circuit for a test operation of a semiconductor system including the semiconductor device. The semiconductor device receives first and second power supply voltages in a normal operation mode from an external device and receives the first power supply voltage in a test operation mode. The semiconductor device includes a voltage level setting unit configured to set a power connection node at a voltage between a voltage level of a first power supply voltage terminal and a voltage level of a ground voltage terminal according to an operation mode signal, and a voltage driving unit configured to drive a second power supply voltage terminal with the first power supply voltage in the test operation mode, wherein the driving power is controlled according to the voltage level of the power connection node.

30 Claims, 5 Drawing Sheets

(56) References Cited

U.S. PATENT DOCUMENTS

| | | | |
|---|---|---|---|
| 2003/0076724 A1* | 4/2003 | Han et al. | 365/201 |
| 2003/0102568 A1* | 6/2003 | Tomishima | 257/777 |
| 2006/0273820 A1* | 12/2006 | Arnold et al. | 326/16 |
| 2010/0060315 A1* | 3/2010 | Eaton | 326/30 |
| 2010/0271078 A1* | 10/2010 | Miller et al. | 327/108 |
| 2011/0075741 A1* | 3/2011 | Li et al. | 375/258 |
| 2011/0267875 A1* | 11/2011 | Kim | 365/163 |
| 2012/0019282 A1* | 1/2012 | Millar | 326/30 |
| 2012/0274396 A1* | 11/2012 | Jang | 327/539 |
| 2013/0116948 A1* | 5/2013 | Cho | 702/58 |
| 2013/0162340 A1* | 6/2013 | Seong | 327/538 |
| 2013/0285701 A1* | 10/2013 | Whetsel | 326/82 |
| 2013/0301330 A1* | 11/2013 | Matsumoto et al. | 365/72 |

\* cited by examiner

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2011-0039667, filed on Apr. 27, 2011, which is incorporated herein by reference in its entirety.

BACKGROUND

1. Field

Exemplary embodiments of the present invention relate to semiconductor design technology, and more particularly, to a semiconductor device and a power voltage supply circuit for a test operation of a semiconductor system including the semiconductor device.

2. Description of the Related Art

Semiconductor devices may operate according to two or more types of power supply voltages received from external devices.

For example, a nonvolatile memory device may receives from separate external devices a first power supply voltage VCCE for data input/output operations and a second power supply voltage VCCQ for operations other than the data input/output operations, where such separate power supply voltage use increases the operation speed of the nonvolatile memory device.

IN providing the first power supply voltage and the second power supply voltage to a nonvolatile memory device, the nonvolatile memory device may have separate input pads for receiving the first power supply voltage VCCE and the second power supply voltage VCCQ and have separate power lines corresponding to the separate input pads.

In a normal operation of a nonvolatile memory device, two power supply voltages having different voltage levels may be applied respectively to two power supply voltage input pads. However, as illustrated in FIG. 1, in a test operation of the nonvolatile memory device, a power supply voltage generated by a power supply voltage transmission driver may be applied in common to two power supply voltage input pads, or a power supply voltage generated by a power supply voltage transmission driver and a power supply voltage generated by a data transmission driver may be applied respectively to two power supply voltage input pads.

Here, two power supply voltages generated through two power supply voltage transmission drivers are not directly applied to one semiconductor device in a test operation of the nonvolatile memory device for reasons stated below.

In general, a plurality of nonvolatile memory devices are connected to test equipment to perform a test operation. Here, the test operation may vary greatly depending on whether the test equipment can supply one power supply voltage or two power supply voltages to the nonvolatile memory devices.

In other words, here may be a limitation in the number of power supply voltages that can be simultaneously supplied by test equipment. The time and cost taken to perform the test operation increase greatly when the test equipment can supply two power supply voltages to the nonvolatile memory devices, as compared to when the test equipment can supply just one power supply voltage to the nonvolatile memory devices.

Thus, to address such features, a power supply voltage transmission driver is used to generate and transmit one of two power supply voltages to the nonvolatile memory device, and a data transmission driver is used to generate and transmit the other power supply voltage to the nonvolatile memory device in a state where a data signal is to maintain a logic-high level.

Here, the data transmission driver of the test equipment may be smaller in size than the power supply voltage transmission driver and may not have a large current driving strength. Therefore, the power supply voltage generated and transmitted by the data transmission driver of the test equipment to the nonvolatile memory device is unstable in voltage level and the time taken to perform the test operation increases as the result.

For example, the data transmission driver of the test equipment may produce a small current equal to, for example, about 40 mA current but no greater than 100 mA current. Here, in designing the power supply voltage transmission driver of the test equipment may be designed to process more than 100 mA current in some occasions, the power supply voltage applied through the data transmission driver of the test equipment to the nonvolatile memory device will have an unstable voltage level and thus, the time taken to perform the test operation increases.

According to an example, if one power supply voltage is applied in common to two power supply voltage input pads in the test operation, a nonvolatile memory device may generate an internal voltage corresponding to a second power supply voltage. To this end, the conventional art may use a voltage down converting scheme.

For example, if a first power supply voltage VCCE has a voltage level of 3.3 V and a second power supply voltage VCCQ has a voltage level of 1.8 V, the first power supply voltage VCCE can be used in generating the second power supply voltage VCCQ with a voltage down converting scheme.

However, in using the first power supply voltage VCCE to generate the second power supply voltage VCCQ with a voltage down converting scheme, a stand-by current and an off-leakage current may occur and thus excess current consumption may occur.

SUMMARY

An embodiment of the present invention is directed to a semiconductor device that uses two or more external power supply voltages and generates two or more stable power supply voltages by receiving one external power supply voltage in a test operation and a semiconductor system including the semiconductor device.

In accordance with an embodiment of the present invention, a semiconductor device for receiving first and second power supply voltages from an external device in a normal operation mode and receiving the first power supply voltage in a test operation mode, includes: a voltage level setting unit configured to set a power connection node at a voltage level between a voltage level of a first power supply voltage terminal and a voltage level of a ground voltage terminal in response to an operation mode signal; and a voltage driving unit configured to drive a second power supply voltage terminal with the first power supply voltage in the test operation mode, wherein the driving power of the voltage driving unit in driving the second power supply voltage terminal is controlled in response to the voltage level of the power connection node.

In accordance with another embodiment of the present invention, a semiconductor system includes: a semiconductor control device configured to generate first and second power supply voltages in a normal operation mode and generate the first power supply voltage in a test operation mode; and a semiconductor device configured to receive the first and second power supply voltages in the normal operation mode to perform first and second internal operations, receive the first power supply voltage in the test operation mode to perform the first internal operation, and generate an internal power supply voltage in the test operation mode with the first power supply voltage to perform the second internal operation.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
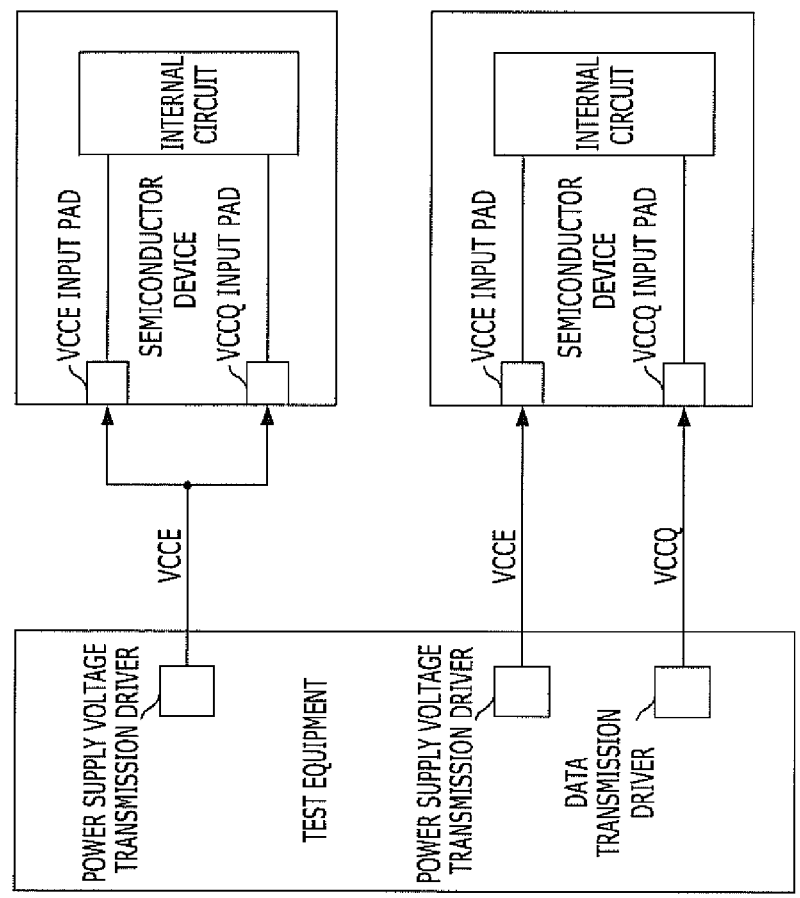
FIG. 1 is a block diagram illustrating that two power supply voltages are provided to a semiconductor device in a test operation according to the conventional art.
Figure 2A:
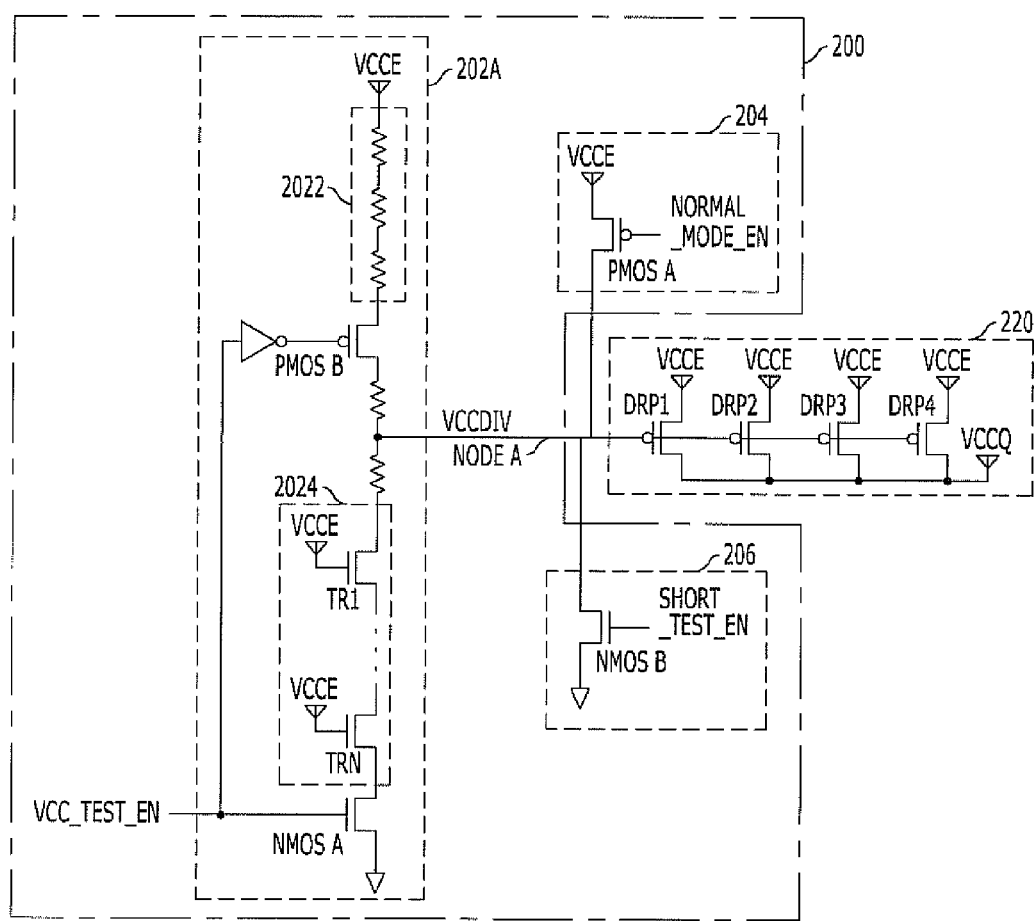
FIG. 2A is a circuit diagram illustrating a power supply voltage generating circuit of a semiconductor device and FIG. 2B illustrates different reference voltage generating units useable for the reference voltage generating unit 202B in FIG. 2B in accordance with an exemplary embodiment of the present invention.
Figure 2B:
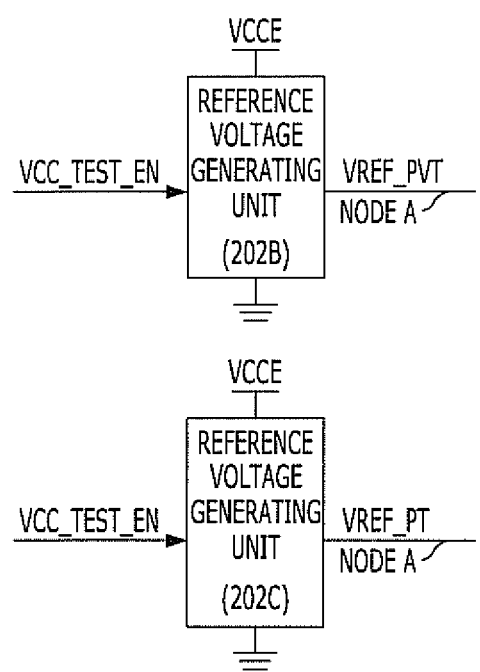

FIG. 2A is a circuit diagram illustrating a power supply voltage generating circuit of a semiconductor device and FIG. 2B illustrates different reference voltage generating units useable for the reference voltage generating unit 202B in FIG. 2B in accordance with an exemplary embodiment of the present invention.

Referring to FIGS. 2A and 2B, a semiconductor device receives a first power supply voltage VCCE and a second power supply voltage VCCQ in a normal operation mode from an external device and receives the first power supply voltage VCCE in a test operation mode. The semiconductor includes a voltage level setting unit 200 configured to set a voltage level of a power connection node (NODE A) between a voltage level of a first power supply voltage (VCCE) terminal and a voltage level of a ground voltage (VSS) terminal according to the operation mode and a voltage driving unit 220 configured to drive a second power supply voltage (VCCQ) terminal with the first power supply voltage VCCE in the test operation mode. Here, the driving power of the voltage driving unit is controlled according to the voltage level of the power connection node (NODE A). The semiconductor device further includes a first internal circuit (not illustrated) configured to receive the first power supply voltage VCCE and perform a desired first internal operation, and a second internal circuit (not illustrated) configured to receive the second power supply voltage VCCQ and perform a desired second internal operation.

The voltage level setting unit 200 includes a first voltage level setting unit (202A or 202B or 202C) configured to set the power connection node (NODE A) at a first voltage level in response to a power transmission test operation enable signal VCC_TEST_EN corresponding to a power transmission test operation mode in the test operation mode, a second voltage level setting unit 204 configured to set the power connection node (NODE A) at a second voltage level in response to a normal operation enable signal NORMAL_MODE_EN, and a third voltage level setting unit 206 configured to set the power connection node (NODE A) at a third voltage level in response to a short test operation enable signal SHORT_TEST_EN corresponding to a short test operation mode in the test operation mode.

The first voltage level setting unit may have any one of the following three configurations.

In a first configuration, the first voltage level setting unit includes a voltage dividing unit 202A configured to divide the voltage level of the first power supply voltage VCCE at a desired division ratio to generate a divided voltage VCCDIV and supply the divided voltage as a voltage with the first voltage level to the power connection node (NODE A), wherein the division ratio is controlled according to a level change of the first power supply voltage (VCCE) terminal to control the voltage level of the divided voltage VCCDIV, and the generating operation is turned on/off in response to the power supply test operation enable signal VCC_TEST_EN.

In the first configuration, the voltage dividing unit 202A includes a first resistor unit 2022 and a first switch unit PMOS B connected in series between the first power supply voltage (VCCE) terminal and the power connection node (NODE A), and a second resistor unit 2024 and a second switch unit NMOS A connected in series between the power connection node (NODE A) and the ground voltage (VSS) terminal, wherein the first resistor unit 2022 has a desired resistance value and a resistance value of the second resistor unit 2024 changes according to the voltage level of the first power supply voltage (VCCE) terminal, and the switching operations of the first switch unit PMOS B and the second switch unit NMOS A are turned on/off in response to the test operation enable signal VCC_TEST_EN. Here, the second resistor unit 2024 includes an NMOS transistor TR<1:N> having a gate connected to the first power supply voltage (VCCE) terminal, a drain connected to the power connection node (NODE A), and a source connected to the ground voltage (VSS) terminal.

In a second configuration of the first voltage level setting unit, the first voltage level setting unit includes a reference voltage generating unit 202B configured to generate a constant reference voltage VREF_PVT, which voltage does not change regardless of a change in PVT (Process, Voltage, Temperature), for being supplied as a voltage with the first voltage level to the power connection node (NODE A). Here, the generated voltage may be a band-gap voltage such as a Widlar bandgap voltage, where the reference voltage generating unit 202B is turned on/off in response to the test operation enable signal VCC_TEST_EN.

In a third configuration of the first voltage level setting unit, the first voltage level setting unit includes a reference voltage generating unit 202C configured to generate a reference voltage VREF_PT, which voltage does not change regardless of a change in PVT (Process, Voltage, Temperature) except that the voltage changes according to a level change of the first power supply (VCCE) voltage. The generated voltage is supplied as a voltage with the first voltage level to the power connection node (NODE A), wherein the generated voltage may be a band-gap voltage such as a Widlar bandgap voltage, where the reference voltage generating unit 202C is turned on/off in response to the test operation enable signal.

The second voltage level setting unit 204 includes a PMOS transistor PMOS A configured to control the connection between its source connected to first power supply voltage (VCCE) terminal and its drain connected to power connection node (NODE A) in response to a normal operation enable signal NORMAL_MODE_EN applied to a gate thereof.

The third voltage level setting unit 206 includes an NMOS transistor NMOS B configured to control the connection between its drain connected to power connection node (NODE A) and its source connected to ground voltage (VSS) terminal in response to the short test operation enable signal SHORT_TEST_EN applied to a gate thereof.

The voltage driving unit 220 includes PMOS transistors DRP1, DRP2, DPR3 and DRP4 configured to control the amount of a current flowing between the first power supply voltage (VCCE) terminal and the second power supply voltage (VCCQ) terminal in response to the voltage level of the power connection node (NODE A) connected to a gate thereof.

With reference to the above-described structure, operations of the power supply voltage generating of the semiconductor device according to an exemplary embodiment of the present invention are described below.

Regarding an operation of the voltage level setting unit 200, in the test operation mode enable period, the voltage level setting unit 200 sets the power connection node (NODE A) to the first voltage level or the third voltage level when the power transmission test operation enable signal VCC_TEST_EN or the short test operation enable signal SHORT_TEST_EN is activated, respectively, and the normal operation enable signal NORMAL_MODE_EN is deactivated (for example, set at a high level logic).

On the other hand, in the normal operation mode enable period, the voltage level setting unit 200 sets the power connection node (NODE A) to the second voltage level when the power transmission test operation enable signal VCC_TEST_EN and the short test operation enable signal SHORT_TEST_EN are deactivated and the normal operation enable signal NORMAL_MODE_EN is activated (for example, set at a low level logic).

When the test operation mode is enabled after the normal operation mode is disabled, the normal operation enable signal NORMAL_MODE_EN is first deactivated (for example, set at a high level logic) and the power transmission test operation enable signal VCC_TEST_EN or the short test operation enable signal SHORT_TEST_EN is subsequently activated (for example, set at a high level logic). On the other hand, when the normal operation mode is enabled after the test operation mode is disabled, the power transmission test operation enable signal VCC_TEST_EN or the short test operation enable signal SHORT_TEST_EN is first deactivated and the normal operation enable signal NORMAL_MODE_EN is subsequently activated (that is, set at a low level logic). This is to prevent a development of a direct short-circuit current path through the power connection node (NODE A) (for example, a short between power supplies or between a power supply and ground).

According to an example, when the test operation mode is enabled after the normal operation mode is disabled, the power transmission test operation enable signal VCC_TEST_EN or the short test operation enable signal SHORT_TEST_EN is activated after more than 200 ns from the deactivation of the normal operation enable signal NORMAL_MODE_EN. Likewise, when the normal operation mode is enabled after the test operation mode is disabled, the normal operation enable signal NORMAL_MODE_EN is activated after more than 200 ns from the deactivation of the power transmission test operation enable signal VCC_TEST_EN or the short test operation enable signal SHORT_TEST_EN. This is to prevent a short-circuit current path from being generated through the power connection node (NODE A).

The activation/deactivation of the normal operation enable signal NORMAL_MODE_EN, the power transmission test operation enable signal VCC_TEST_EN and the short test operation enable signal SHORT_TEST_EN may be controlled by a semiconductor device operation control unit such as an MRS (Memory Register Set) of a semiconductor memory device or any other reasonably suitable circuitry.

When the voltage level of the power connection node (NODE A) is determined by the voltage level setting unit 200, the driving power of the voltage driving unit 220 is controlled to determine the voltage level of the second power supply voltage (VCCQ) terminal in response to the voltage level of the power connection node (NODE A).

Specifically, the voltage driving unit 220 controls the amount of a current, flowing from the first power supply voltage (VCCE) terminal and the second power supply voltage (VCCQ) terminal, according to the voltage level of the power connection node (NODE A).

Accordingly, a current does not flow from the first power supply voltage (VCCE) terminal to the second power supply voltage (VCCQ) terminal when the power connection node (NODE A) is set to the second voltage level in the normal operation mode. That is, as illustrated in FIG. 2A, when the voltage driving unit 220 includes PMOS transistors DRP1, DRP2, DRP3 and DRP4, the voltage level of the power connection node (NODE A) becomes the first power supply voltage VCCE, so that the PMOS transistors DRP1, DRP2, DRP3 and DRP4 of the voltage driving unit 220 controls a current not to flow from the first power supply voltage (VCCE) terminal to the second power supply voltage (VCCQ) terminal through the voltage driving unit 220.

Here, a current flows from the first power supply voltage (VCCE) terminal to the second power supply voltage (VCCQ) terminal when the power connection node (NODE A) is set to the first voltage level in the power transmission test operation mode. More specifically, as illustrated in FIG. 2A, when the voltage driving unit 220 includes PMOS transistors DRP1, DRP2, DRP3 and DRP4, the first voltage level at the power connection node (NODE A) becomes a voltage level lower than the voltage level of the first power supply voltage VCCE but higher than the ground voltage (VSS), so that the PMOS transistors DRP1, DRP2, DRP3 and DRP4 of the voltage driving unit 220 control a first current to flow from the first power supply voltage (VCCE) terminal to the second power supply voltage (VCCQ) terminal through the voltage driving unit 220.

According to an example, in the first and third configurations (but not in the second configuration) of the voltage level setting unit 200, the first voltage level at the power connection node (NODE A) changes according to a voltage level change of the first power supply voltage VCCE. For example, the first voltage level at the power connection node (NODE A) when the first power supply voltage VCCE is equal to 3.3 V becomes lower than the first voltage level at the power connection node (NODE A) when the first power supply voltage VCCE is equal to 2.7 V, and the voltage level of the second power supply voltage VCCQ decreases from 1.8 V to 1.6 V, respectively. In the second configuration of the voltage level setting unit 200 (that is, a configuration using reference voltage generating unit 202B), the first voltage level at the power connection node (NODE A) does not change even when the voltage level of the first power supply voltage VCCE changes.

According to an example, a current, which is larger than the current flowing from the first power supply voltage (VCCE) terminal to the second power supply voltage (VCCQ) terminal when the power connection node (NODE A) is set to the first voltage level in the power transmission test operation mode, flows from the first power supply voltage (VCCE) terminal to the second power supply voltage (VCCQ) terminal when the power connection node (NODE A) is set to the third voltage level in the short test operation mode. More specifically, as illustrated in FIG. 2A, when the voltage driving unit 220 includes PMOS transistors DRP1, DRP2, DRP3 and DRP4, the third voltage level at the power connection node (NODE A) is the same as the ground voltage VSS, so that the PMOS transistors DRP1, DRP2, DRP3 and DRP4 of the voltage driving unit 220 controls a current to flow from the first power supply voltage (VCCE) terminal to the second power supply voltage (VCCQ) terminal by, for example, completely turning on PMOS transistors DRP1, DRP2, DRP3 and DRP4 so that the first power supply voltage (VCCE) terminal and the second power supply voltage (VCCQ) terminal have the same voltage level.

Figure 3A:
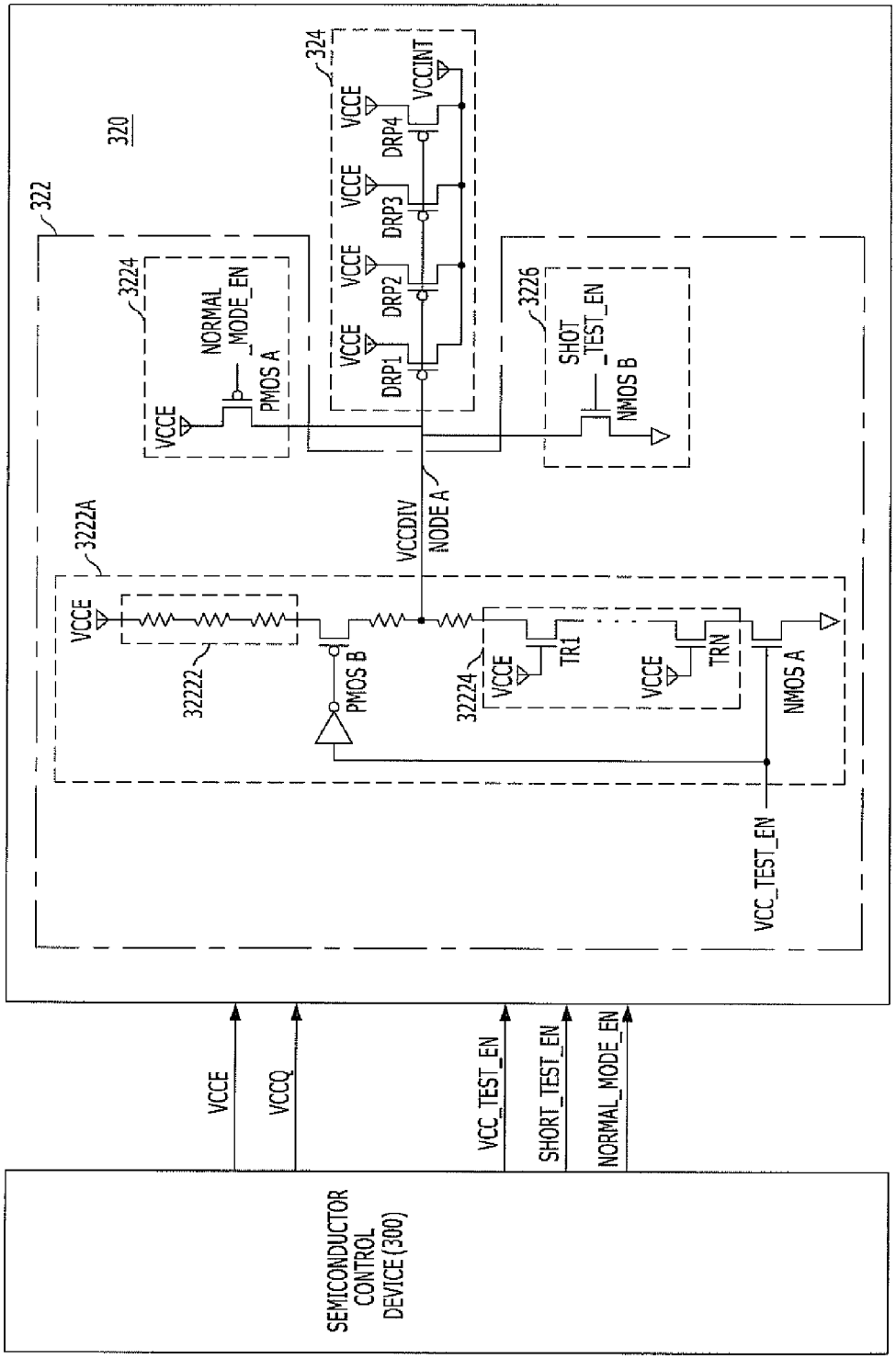
FIG. 3A is a block diagram illustrating a semiconductor system including a semiconductor device of FIG. 2
Figure 3B:
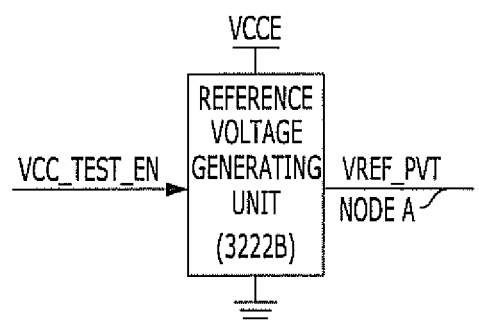
FIG. 3B illustrates different reference voltage generating units useable for the reference voltage generating unit 202B in FIG. 3A in accordance with an exemplary embodiment of the present invention.
Figure 3B:
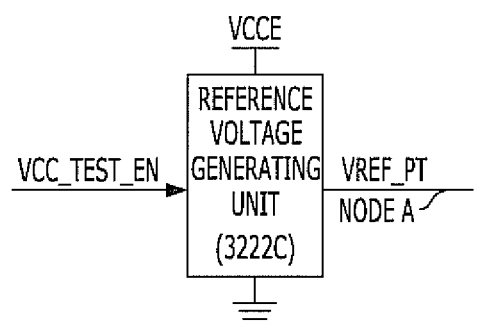

FIG. 3A is a block diagram illustrating a semiconductor system including the semiconductor device of FIG. 2 and FIG. 3B illustrates different reference voltage generating units useable for the reference voltage generating unit 202B in FIG. 3A in accordance with an exemplary embodiment of the present invention.

Referring to FIGS. 3A and 3B, a semiconductor system including a semiconductor device in accordance with an exemplary embodiment of the present invention includes a semiconductor control device 300 configured to generate a first power supply voltage VCCE and a second power supply voltage VCCQ in a normal operation mode and generate the first power supply voltage VCCE in a test operation mode, and a semiconductor device 320 configured to receive the first power supply voltage VCCE and the second power supply voltage VCCQ in the normal operation mode to perform a first internal operation and a second internal operation, receive the first power supply voltage VCCE in the test operation mode to perform a first internal operation, and generate an internal power supply voltage VCCINT in the test operation mode on the basis of the voltage level of the first power supply voltage VCCE to perform a second internal operation.

Here, the semiconductor control device 300 generates a normal operation enable signal NORMAL_MODE_EN for enabling the normal operation mode, a power transmission test operation enable signal VCC_TEST_EN for enabling the power transmission test operation mode in the test operation mode, and a short test operation enable signal SHORT_TEST_EN for enabling the short test operation mode in the test operation mode and provides the normal operation enable signal NORMAL_MODE_EN, power transmission test operation enable signal VCC_TEST_EN, and the short test operation enable signal SHORT_TEST_EN to the semiconductor device 320.

Here, the semiconductor device 320 includes a voltage level setting unit 322 configured to set a voltage level of a power connection node (NODE A) between a voltage level of a first power supply voltage (VCCE) terminal and a voltage level of a ground voltage (VCC) terminal according to the operation mode, and a voltage driving unit 324 configured to drive an internal power supply voltage (VCCINT) terminal with the first power supply voltage VCCE in a test operation mode, wherein the driving power is controlled according to the voltage level of the power connection node (NODE A). The semiconductor device 320 further includes a first internal circuit (not illustrated) configured to receive the first power supply voltage VCCE and perform a first internal operation, and a second internal circuit (not illustrated) configured to receive the second power supply voltage VCCQ or the internal power supply voltage VCCINT and perform a second internal operation.

The voltage level setting unit 322 includes a first voltage level setting unit (3222A, 3222B, or 3222C) configured to set the power connection node (NODE A) at a first voltage level in response to a power transmission test operation enable signal VCC_TEST_EN corresponding to a power transmission test operation mode in the test operation mode, a second voltage level setting unit 3224 configured to set the power connection node (NODE A) at a second voltage level in response to a normal operation enable signal NORMAL_MODE_EN, and a third voltage level setting unit 3226 configured to set the power connection node (NODE A) at a third voltage level in response to a short test operation enable signal SHORT_TEST_EN corresponding to a short test operation mode in the test operation mode.

The first voltage level setting unit may have any one of the following three configurations.

As the first configuration, the first voltage level setting unit includes a voltage dividing unit 3222A configured to divide the voltage level of the first power supply voltage VCCE in a desired division ratio to generate a divided voltage VCCDIV and supply the divided voltage as a voltage with the first voltage level to the power connection node (NODE A), wherein the desired division ratio is controlled according to a level change of the first power supply voltage (VCCE) terminal to control the voltage level of the divided voltage VCCDIV, and the generating operation is turned on/off in response to the power supply test operation enable signal VCC_TEST_EN.

In the first configuration, the voltage dividing unit 3222A includes a first resistor unit 32222 and a first switch unit PMOS B connected in series between the first power supply voltage (VCCE) terminal and the power connection node (NODE A), and a second resistor unit 32224 and a second switch unit NMOS A connected in series between the power connection node (NODE A) and the ground voltage (VSS) terminal, wherein the first resistor unit 32222 has a desired resistance value and a resistance value of the second resistor unit 32224 changes according to the voltage level of the first power supply voltage (VCCE) terminal, and the switching operations of the first switch unit PMOS B and the second switch unit NMOS A are turned on/off in response to the test operation enable signal VCC_TEST_EN. Here, the second resistor unit 32224 includes an NMOS transistor TR<1:N> having a gate connected to the first power supply voltage (VCCE) terminal, a drain connected to the power connection node (NODE A), and a source connected to the ground voltage (VSS) terminal.

In the second configuration of the first voltage level setting unit, the first voltage level setting unit includes a reference voltage generating unit 3222B configured to generate a reference voltage VREF_PVT, which voltage does not change regardless of a change in PVT (Process, Voltage, Temperature) for being supplied as a voltage with the first voltage level to the power connection node (NODE A). Here, the generated voltage may be a band-gap voltage such as a Widlar bandgap voltage, where the reference voltage generating unit 3222B is turned on/off in response to the test operation enable signal VCC_TEST_EN.

In the third configuration of the first voltage level setting unit, the first voltage level setting unit includes a reference voltage generating unit 3222C configured to generate a reference voltage VREF_PT, which voltage does not change regardless of a change in PVT (Process, Voltage, Temperature) except that the voltage changes according to a level change of the first power supply (VCCE) voltage. The generated voltage is supplied as the first voltage level to the power connection node (NODE A), wherein the generated voltage may be a band-gap voltage such as a Widlar bandgap voltage, where the reference voltage generating unit 202C is turned on/off in response to the test operation enable signal.

The second voltage level setting unit 3224 includes a PMOS transistor PMOS A configured to control the connection between its source connected to first power supply voltage (VCCE) terminal and its drain connected to power connection node (NODE A) in response to the normal operation enable signal NORMAL_MODE_EN applied to a gate thereof.

The third voltage level setting unit 3226 includes an NMOS transistor NMOS B configured to control the connection between its drain connected to power connection node (NODE A) and the source connected to ground voltage (VSS) terminal in response to the short test operation enable signal SHORT_TEST_EN applied to a gate thereof.

The voltage driving unit 324 includes PMOS transistors DRP1, DRP2, DPR3 and DRP4 configured to control the amount of a current, flowing between the first power supply voltage (VCCE) terminal and the internal power supply voltage (VCCINT) terminal in response to the voltage level of the power connection node (NODE A) connected to a gate thereof.

The operation of the semiconductor system is summarized as follows. In the semiconductor system, during a normal operation, the semiconductor control device 300 activates the normal operation enable signal NORMAL_MODE_EN, deactivates the power transmission test operation enable signal VCC_TEST_EN and the short test operation enable signal SHORT_TEST_EN, and transmits the activated normal operation enable signal NORMAL_MODE_EN, the deactivated power transmission test operation enable signal VCC_TEST_EN and the deactivated short test operation enable signal SHORT_TEST_EN, together with the first power supply voltage VCC and the second power supply voltage VCCQ, to the semiconductor device 320. Here, the semiconductor device 320 performs a desired first internal operation according to the first power supply voltage VCCE and performs a desired second internal operation according to the second power supply voltage VCCQ. For example, the first internal operation may be a buffering operation of an input/output buffer, and the second internal operation may be a source dividing operation of a cell array.

Also, in the semiconductor system, during a test operation, the semiconductor control device 300 deactivates the normal operation enable signal NORMAL_MODE_EN, activates the power transmission test operation enable signal VCC_TEST_EN or the short test operation enable signal SHORT_TEST_EN, and transmits the deactivated normal operation enable signal NORMAL_MODE_EN and the activated power transmission test operation enable signal VCC_TEST_EN or the activated short test operation enable signal SHORT_TEST_EN, together with the first power supply voltage VCCE, to the semiconductor device 320. Here, the semiconductor device 320 generates an internal power supply voltage VCCINT using the first power supply voltage VCCE, performs a desired first internal operation according to the first power supply voltage VCCE, and performs a desired second internal operation according to the internal power supply voltage VCCINT. According to an example, the first internal and the second internal operation are the same as both the normal operation mode and the test operation mode.

The semiconductor device 320 included in the semiconductor system operates in the same manner as the semiconductor device illustrated in FIG. 2, and thus a detailed description thereof is omitted as being redundant.

As described above, according to the exemplary embodiments of the present invention, the semiconductor device using two or more external power supply voltages generates a second power supply voltage using an external power supply voltage in the test operation, thereby performing a test operation as in the case where two external power supply voltages are received. Accordingly, the number of semiconductor devices that can be tested at the same time is increased to thus reduce manufacturing costs for performing tests.

Also, the present invention is not limited to any particular semiconductor device by accommodating both a variable internal power supply based on changes in the external power supply voltage and a constant voltage that does not change in response to the external power supply voltage.

According to exemplary embodiments, the positions and types of the logic gates and transistors in circuitry may be differently implemented depending on the polarities of the input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor device for receiving first and second power supply voltages from an external device in a normal operation mode and receiving the first power supply voltage in a test operation mode, comprising:
a voltage level setting unit configured to set a power connection node at a voltage level between a voltage level of a first power supply voltage terminal and a voltage level of a ground voltage terminal in response to an operation mode signal; and
a voltage driving unit configured to drive a second power supply voltage terminal with the first power supply voltage in the test operation mode, wherein the driving power of the voltage driving unit in driving the second power supply voltage terminal is controlled in response to the voltage level of the power connection node.

2. The semiconductor device of claim 1, further comprising:
a first internal circuit configured to receive the first power supply voltage and perform a first internal operation; and
a second internal circuit configured to receive the second power supply voltage and perform a second internal operation.

3. The semiconductor device of claim 1, wherein the voltage level setting unit comprises:
a first voltage level setting unit configured to set the power connection node at a first voltage level in response to a power transmission test operation enable signal corresponding to a power transmission test operation mode in the test operation mode;
a second voltage level setting unit configured to set the power connection node at a second voltage level in response to a normal operation enable signal; and
a third voltage level setting unit configured to set the power connection node at a third voltage level in response to a short test operation enable signal corresponding to a short test operation mode in the test operation mode.

4. The semiconductor device of claim 1, wherein the voltage level setting unit comprises a reference voltage generating unit configured to generate a band-gap reference voltage with a constant voltage level regardless of a change in PVT (Process, Voltage, Temperature) and supply the band-gap voltage to the power connection node as a voltage with the first voltage level, wherein the voltage level setting unit is configured to be turned on/off in response to the power transmission test operation enable signal.

5. The semiconductor device of claim 1, wherein the voltage level setting unit comprises a reference voltage generating unit configured to generate a band-gap reference voltage that changes in response to a voltage level change of the first power supply voltage and supply the band-gap voltage to the power connection node as a voltage with the first voltage level, wherein the voltage level setting unit is configured to be turned on/off in response to the power transmission test operation enable signal.

6. The semiconductor device of claim 1, wherein the voltage level setting unit comprises a voltage dividing unit configured to divide a voltage level of the first power supply voltage and supply a voltage obtained from the voltage division to the power connection node as a voltage with the first voltage level, wherein a division ratio of the voltage division is controlled in response to a change in the voltage level of the first power supply voltage terminal and the voltage level setting unit is configured to be turned on/off in response to the power supply test operation enable signal.

7. The semiconductor device of claim 6, wherein the voltage dividing unit comprises:
a first resistor unit and a first switch unit connected in series between the first power supply voltage terminal and the power connection node; and
a second resistor unit and a second switch unit connected in series between the power connection node and the ground voltage terminal,
wherein resistance values of the first resistor unit and the second resistor unit are configured to change according to the voltage level of the first power supply voltage terminal, and
the first and second switch units are configured to be turned on/off in response to the power transmission test operation enable signal.

8. The semiconductor device of claim 7, wherein the second resistor unit comprises an NMOS transistor having a gate connected to the first power supply voltage terminal, a drain connected to the power connection node, and a source connected to the ground voltage terminal.

9. The semiconductor device of claim 1, wherein the voltage driving unit is configured to control a current flowing from the first power supply voltage terminal and the second power supply voltage terminal in response to the voltage level of the power connection node.

10. The semiconductor device of claim 3, wherein the voltage driving unit is configured to:
control a current not to flow from the first power supply voltage terminal to the second power supply voltage terminal when the power connection node is set at the second voltage level,
control a first current to flow from the first power supply voltage terminal to the second power supply voltage terminal when the power connection node is set at the first voltage level, and
control a second current larger than the first current to flow from the first power supply voltage terminal to the second power supply voltage terminal when the power connection node is set at the third voltage level.

11. The semiconductor device of claim 1, wherein the voltage driving unit comprises a PMOS transistor configured to control a current flowing between the first power supply voltage terminal and the second power supply voltage terminal in response to the voltage level of the power connection node connected to a gate thereof.

12. The semiconductor device of claim 3, wherein the second voltage level is the voltage level of the first power supply voltage terminal and the third voltage level is the voltage level of the ground voltage terminal.

13. The semiconductor device of claim 3, wherein the voltage level setting unit is configured to:
set the power connection node to the first or third voltage level in the test operation mode when the power transmission test operation enable signal or the short test operation enable signal is activated and the normal operation enable signal is deactivated, and
set the power connection node to the second voltage level in the normal operation mode when the power transmission test operation enable signal and the short test operation enable signal are deactivated and the normal operation enable signal is activated.

14. The semiconductor device of claim 13, wherein
when the test operation mode is enabled after the normal operation mode is disabled, the normal operation enable signal is first deactivated and the power transmission test operation enable signal or the short test operation enable signal is subsequently activated, and
when the normal operation mode is enabled after the test operation mode is disabled, the power transmission test operation enable signal or the short test operation enable signal is first deactivated and the normal operation enable signal is subsequently activated.

15. A semiconductor system comprising:
a semiconductor control device configured to generate first and second power supply voltages in a normal operation mode and generate the first power supply voltage in a test operation mode; and
a semiconductor device configured to receive the first and second power supply voltages in the normal operation mode to perform first and second internal operations, receive the first power supply voltage in the test operation mode to perform the first internal operation, and generate an internal power supply voltage in the test operation mode with the first power supply voltage to perform the second internal operation.

16. The semiconductor system of claim 15, wherein the semiconductor device comprises:
a voltage level setting unit configured to set a power connection node at a voltage level between a voltage level of a first power supply voltage terminal and a voltage level of a ground voltage terminal in response to an operation mode signal; and
a voltage driving unit configured to drive an internal power supply voltage terminal with the first power supply voltage in the test operation mode, wherein the driving power of the voltage driving unit in driving the second power supply voltage terminal is controlled in response to the voltage level of the power connection node.

17. The semiconductor system of claim 15, wherein the semiconductor device further comprises:
a first internal circuit configured to receive the first power supply voltage and perform the first internal operation; and
a second internal circuit configured to receive the second power supply voltage or the internal power supply voltage and perform the second internal operation.

18. The semiconductor system of claim 16, wherein the voltage level setting unit comprises:
- a first voltage level setting unit configured to set the power connection node at a first voltage level in response to a power transmission test operation enable signal corresponding to a power transmission test operation mode in the test operation mode;
- a second voltage level setting unit configured to set the power connection node at a second voltage level in response to a normal operation enable signal; and
- a third voltage level setting unit configured to set the power connection node at a third voltage level in response to a short test operation enable signal corresponding to a short test operation mode in the test operation mode.

19. The semiconductor system of claim 16, wherein the voltage level setting unit comprises a band-gap reference voltage with a constant voltage level regardless of a change in PVT (Process, Voltage, Temperature) and supply the band-gap voltage to the power connection node as a voltage with the first voltage level, wherein the voltage level setting unit is configured to be turned on/off in response to the power transmission test operation enable signal.

20. The semiconductor system of claim 16, wherein the voltage level setting unit comprises a reference voltage generating unit configured to generate a band-gap reference voltage that changes in response to a voltage level change of the first power supply voltage and supply the band-gap voltage to the power connection node as a voltage with the first voltage level, wherein the voltage level setting unit is configured to be turned on/off in response to the power transmission test operation enable signal.

21. The semiconductor system of claim 16, wherein the voltage level setting unit comprises a voltage dividing unit configured to divide a voltage level of the first power supply voltage and supply a voltage obtained from the voltage division to the power connection node as a voltage with the first voltage level, wherein a division ratio of the voltage division is controlled in response to a change in the voltage level of the first power supply voltage terminal and the voltage level setting unit is configured to be turned on/off in response to the power supply test operation enable signal.

22. The semiconductor system of claim 21, wherein the voltage dividing unit comprises:
- a first resistor unit and a first switch unit connected in series between the first power supply voltage terminal and the power connection node; and
- a second resistor unit and a second switch unit connected in series between the power connection node and the ground voltage terminal,
- wherein resistance values of the first resistor unit and the second resistor unit are configured to change according to the voltage level of the first power supply voltage terminal, and
- the first and second switch units are configured to be turned on/off in response to the power transmission test operation enable signal.

23. The semiconductor system of claim 22, wherein the second resistor unit comprises an NMOS transistor having a gate connected to the first power supply voltage terminal, a drain connected to the power connection node, and a source connected to the ground voltage terminal.

24. The semiconductor system of claim 16, wherein the voltage driving unit is configured to control a current flowing from the first power supply voltage terminal and the second power supply voltage terminal in response to the voltage level of the power connection node.

25. The semiconductor system of claim 18, wherein the voltage driving unit is configured to:
- control a current not to flow from the first power supply voltage terminal to the internal power supply voltage terminal when the power connection node is set at the second voltage level,
- control a first current to flow from the first power supply voltage terminal to the internal power supply voltage terminal when the power connection node is set at the first voltage level, and
- control a second current larger than the first current to flow from the first power supply voltage terminal to the internal power supply voltage terminal when the power connection node is set at the third voltage level.

26. The semiconductor system of claim 16, wherein the voltage driving unit comprises a PMOS transistor configured to control a current flowing between the first power supply voltage terminal and the second power supply voltage terminal in response to the voltage level of the power connection node connected to a gate thereof.

27. The semiconductor system of claim 18, wherein the second voltage level is the voltage level of the first power supply voltage terminal and the third voltage level is the voltage level of the ground voltage terminal.

28. The semiconductor system of claim 18, wherein the voltage level setting unit is configured to:
- set the power connection node to the first or third voltage level in the test operation mode when the power transmission test operation enable signal or the short test operation enable signal is activated and the normal operation enable signal is deactivated, and
- set the power connection node to the second voltage level in the normal operation mode when the power transmission test operation enable signal and the short test operation enable signal are deactivated and the normal operation enable signal is activated.

29. The semiconductor system of claim 28, wherein
- when the test operation mode is enabled after the normal operation mode is disabled, the normal operation enable signal is first deactivated and the power transmission test operation enable signal or the short test operation enable signal is subsequently activated, and
- when the normal operation mode is enabled after the test operation mode is disabled, the power transmission test operation enable signal or the short test operation enable signal is first deactivated and the normal operation enable signal is subsequently activated.

30. The semiconductor system of claim 18, wherein the semiconductor control device is configured to generate and provide the normal operation enable signal, the power transmission test operation enable signal, and the short test operation enable signal to the semiconductor device.

* * * * *